United States Patent
Chun

(10) Patent No.: US 9,589,898 B2
(45) Date of Patent: Mar. 7, 2017

(54) SEMICONDUCTOR DEVICE HAVING AIR-GAP AND METHOD FOR MANUFACTURING THE SAME

(71) Applicant: SK hynix Inc., Gyeonggi-do (KR)

(72) Inventor: Jae Houb Chun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 9 days.

(21) Appl. No.: 14/874,080

(22) Filed: Oct. 2, 2015

(65) Prior Publication Data

US 2016/0351501 A1 Dec. 1, 2016

(30) Foreign Application Priority Data

May 27, 2015 (KR) .................. 10-2015-0073634

(51) Int. Cl.
| | |
|---|---|
| H01L 29/49 | (2006.01) |
| H01L 23/532 | (2006.01) |
| H01L 21/768 | (2006.01) |
| H01L 21/311 | (2006.01) |
| H01L 27/108 | (2006.01) |
| H01L 23/528 | (2006.01) |
| H01L 21/3213 | (2006.01) |

(52) U.S. Cl.
CPC .... *H01L 23/5329* (2013.01); *H01L 21/31105* (2013.01); *H01L 21/32133* (2013.01); *H01L 21/7682* (2013.01); *H01L 21/76805* (2013.01); *H01L 21/76885* (2013.01); *H01L 23/528* (2013.01); *H01L 27/1085* (2013.01); *H01L 27/10805* (2013.01); *H01L 27/10885* (2013.01)

(58) Field of Classification Search
CPC .................. H01L 23/5329; H01L 23/528
See application file for complete search history.

(56) References Cited

U.S. PATENT DOCUMENTS

| | | | | |
|---|---|---|---|---|
| 8,642,466 B2* | 2/2014 | Kim | .................. | H01L 21/76897 438/619 |
| 8,921,223 B2* | 12/2014 | Lee | .................. | H01L 27/10855 438/619 |
| 2013/0320549 A1* | 12/2013 | Lee | .................... | H01L 21/76897 257/773 |
| 2013/0328199 A1 | 12/2013 | Yun et al. | | |
| 2014/0187037 A1* | 7/2014 | Rho | ....................... | H01L 29/92 438/626 |
| 2014/0306351 A1* | 10/2014 | Kim | .................. | H01L 21/76855 257/774 |
| 2015/0014759 A1* | 1/2015 | Lee | ..................... | H01L 23/5329 257/306 |
| 2015/0061134 A1* | 3/2015 | Lee | ....................... | H01L 21/764 257/751 |
| 2015/0132936 A1* | 5/2015 | Rho | .................... | H01L 21/7682 438/587 |

(Continued)

FOREIGN PATENT DOCUMENTS

KR 1020130137393 12/2013

*Primary Examiner* — Michael Shingleton
(74) *Attorney, Agent, or Firm* — IP & T Group LLP

(57) ABSTRACT

A semiconductor device in which an air-gap located at a side of a bit line stack is extended to an upper part of the bit line stack is disclosed. An embodiment includes: a bit line stack; a plurality of storage node contacts located at both sides of the bit line stack; and an air-gap located between the bit line stack and the storage node contacts, and extended above the bit line stack.

10 Claims, 29 Drawing Sheets

(56) References Cited

U.S. PATENT DOCUMENTS

| | | | |
|---|---|---|---|
| 2015/0214314 A1* | 7/2015 | Oh | H01L 29/4236 |
| | | | 257/330 |
| 2015/0255466 A1* | 9/2015 | Hwang | H01L 21/02164 |
| | | | 438/586 |
| 2015/0333069 A1* | 11/2015 | Kim | H01L 29/401 |
| | | | 257/334 |

* cited by examiner

SEMICONDUCTOR DEVICE HAVING AIR-GAP AND METHOD FOR MANUFACTURING THE SAME

CROSS-REFERENCE TO RELATED APPLICATION

The priority of Korean patent application No. 10-2015-0073634 filed on 27 May 2015, the disclosure of which is hereby incorporated in its entirety by reference, is claimed.

BACKGROUND OF THE INVENTION

Embodiments of the present disclosure relate to a semiconductor device and a method for fabricating the same and, more particularly, to a semiconductor device having reduced parasitic capacitance between bit lines or storage nodes and a method for fabricating the same.

As integration of semiconductor devices increases, the spacing between metal lines formed on the same plane is reduced. However, when the spacing between the metal lines is reduced, crosstalk between the metal lines may occur, and parasitic capacitance increases between metal lines, which are isolated by insulation films. Therefore, electrical signals that are sent through the metal lines may not transmit properly and/or the transmission speed of electrical signals may be reduced.

Since a plurality of metal lines is formed in a small space, the width of the metal lines is reduced and resistance increases due to the reduction in thickness of the metal lines. Resistance and parasitic capacitance of the metal lines increases overall resistance, disturbing the flow of electrical signals and delaying signal transmission due to phase changes. Since signal transmission delay deteriorates semiconductor device efficiency and performance, it must be suppressed. Accordingly, a method for reducing parasitic capacitance and resistance of the metal lines is needed. One method for reducing parasitic capacitance between metal lines is reducing the width of metal lines and increasing the spacing between the metal lines. However, since resistance depends on metal line thickness, there is a limit on how thin the metal lines can be formed. Additionally, increasing the spacing between metal lines conflicts with the goal of increasing integration density.

BRIEF SUMMARY OF THE INVENTION

Various embodiments of the present disclosure are directed to providing a semiconductor device having an air-gap and a method for fabricating the same that solves one or more problems in the related art.

An embodiment of the present disclosure relates to a semiconductor device having an air-gap for reducing parasitic capacitance between metal lines, and a method for fabricating the same.

In accordance with an embodiment of the present disclosure, a semiconductor device includes: a bit line stack; a plurality of storage node contacts located at both sides of the bit line stack; and an air-gap located between the bit line stack and the storage node contacts, and extended above the bit line stack.

In accordance with another embodiment of the present disclosure, a method for fabricating a semiconductor device includes: forming a bit line stack; forming a spacer including a first sacrificial film at both sidewalls of the bit line stack; forming a storage node contact damascene pattern defining a storage node contact hole at a position between the bit line stacks; forming a first storage node contact at a lower part of the storage node contact hole; forming a conductive film over the first storage node contact and the bit line stack to bury the storage node contact hole; etching the conductive film to expose the first sacrificial film, and forming a trench; forming a second sacrificial film coupled to the first sacrificial film at an inner sidewall of the trench; forming an interlayer insulation film over the second sacrificial film to bury the trench; etching the conductive film in a direction perpendicular to the bit line stack in such that the conductive film is isolated, and forming a second storage node contact; forming an air-gap by etching the first sacrificial film and the second sacrificial film; and forming a capping film such that an upper part of the air-gap is capped with the capping film.

It is to be understood that both the foregoing general description and the following detailed description of embodiments are exemplary and explanatory.

DESCRIPTION OF EMBODIMENTS

Reference will now be made in detail to embodiments, examples of which are illustrated in the accompanying drawings. Wherever possible, the same reference numbers will be used throughout the drawings to refer to the same or like parts. In the following description, a detailed description of known configurations or functions incorporated herein will be omitted when it may make the subject matter less clear.

Figure 1:
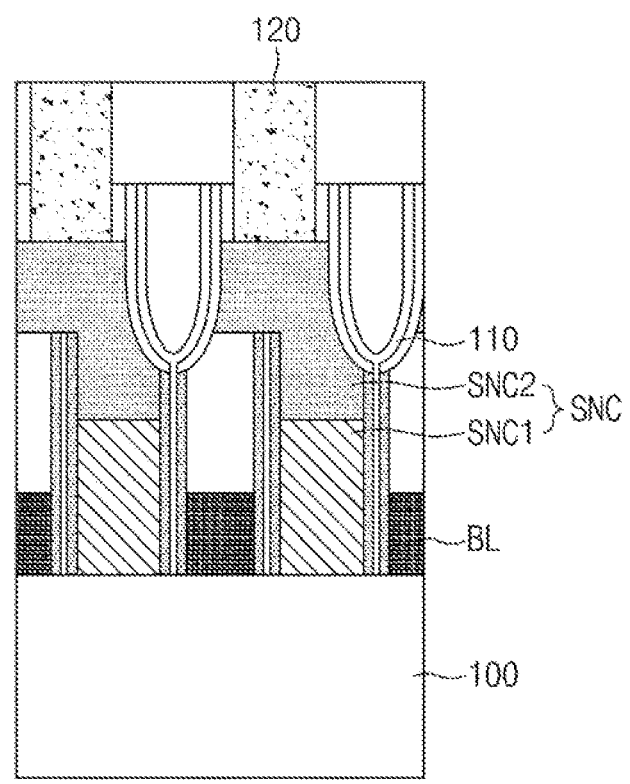
FIG. 1 is a structural view illustrating a semiconductor device having an air-gap according to an embodiment of the present disclosure.

FIG. 1 is a structural view illustrating a semiconductor device having an air-gap according to an embodiment of the present disclosure.

Referring to FIG. 1, a bit line BL and a storage node contact SNC may be formed over a lower structure 100 having both an active region (not shown) and a device isolation film defining the active region in such a manner that the bit line BL and the storage node contact SNC are connected to the active region. The storage node contact SNC may include a first storage node contact SNC1; and a second storage node contact SNC2 formed over the first storage node contact SNC1 such that the second storage node contact SNC2 is coupled to the first storage node contact SNC1.

The active region may be formed in a rectangular shape having a long-axis and a short-axis, and may have a $6F^2$ structure in which a long-axis is extended in a diagonal direction. In addition, the lower structure 100 may include a buried gate (not shown) that is buried in both the active region and the device isolation film while simultaneously being perpendicular to the bit line BL.

The buried gate may be formed to cross the active region, and the active region may be divided into three active regions on the basis of two crossing buried gates. The central active region of three active regions may be coupled to the bit line BL, and the remaining exterior active regions may be coupled to the first storage node contact SNC1. The second storage node contact SNC2 formed over the first storage node contact SNC1 may be coupled to a storage node 120 of a capacitor.

An air-gap 110 may be formed between the bit line BL and the first storage node contact SNC1. In addition, the air-gap 110 may be extended not only to a region interposed between the bit line BL and the first storage node contact SNC1, but also to another region interposed between the second storage node contacts SNC2 disposed over the first storage node contact SNC1. The air-gap 110 extended to the region interposed between the second storage node contacts SNC2 may have a U-shaped double-layered structure.

As described above, the air-gap 110 may be extended to the region interposed between the second storage node contacts SNC2, which are contiguous, such that not only parasitic capacitance between the bit line BL and the first storage node contact SNC1 but also parasitic capacitance between the second storage node contacts SNC2, which are contiguous, can be minimized. Specifically, since the air-gap between the second storage node contacts SNC2 is formed to have a double-layered structure, the occurrence of parasitic capacitance between the second storage node contacts SNC2, which are contiguous, can be prevented.

FIGS. 2A, 3A, 4A, 5A, 6A, 7A, 8A, 9A, 10A, 11A, 12A, 13A, and 14A are plan views illustrating a method for fabricating a semiconductor device according to an embodiment of the present disclosure. FIGS. 2B, 3B, 4B, 5B, 6B, 7B, 8B, 9B, 10B, 11B, 12B, 13B, and 14B are cross-sectional views illustrating the semiconductor devices taken along the lines A-A' of FIGS. 2A to 14A. FIGS. 2C, 3C, 4C, 5C, 6C, 7C, 8C, 9C, 10C, 11C, 12C, 13C, and 14C are cross-sectional views illustrating the semiconductor devices taken along the lines B-B' of FIGS. 2A to 14A.

Figure 2A:
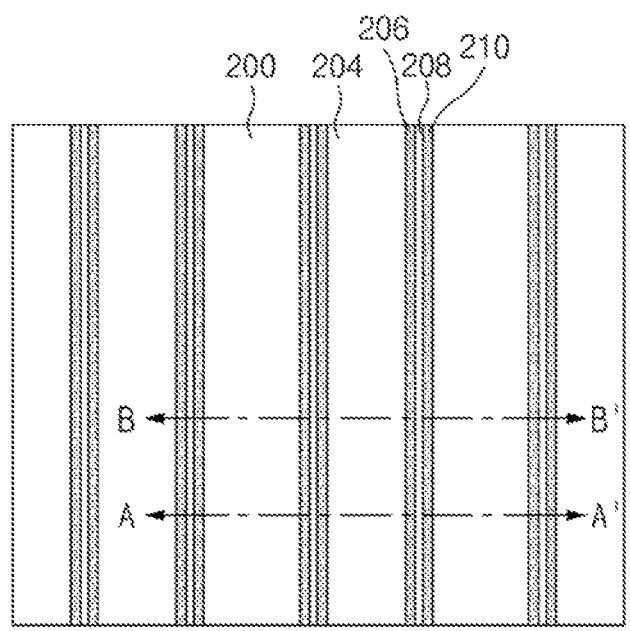
FIGS. 2A, 3A, 4A, 5A, 6A, 7A, 8A, 9A, 10A, 11A 12A, 13A, and 14A are plan views illustrating a method for forming a semiconductor device according to an embodiment of the present disclosure.
Figure 2B:
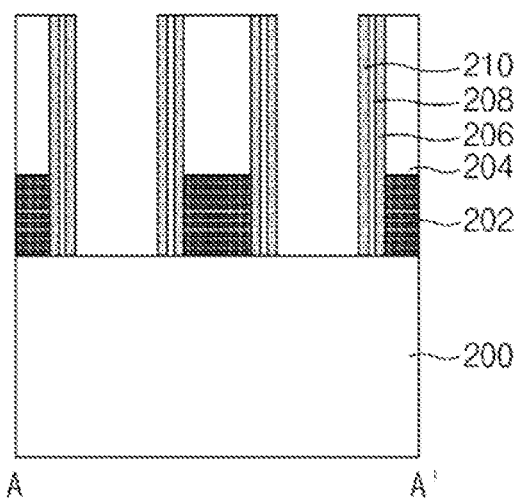
FIGS. 2B, 3B, 4B, 5B, 6B, 7B, 8B, 9B, 10B, 11B, 12B, 13B, and 14B are cross-sectional views illustrating the semiconductor devices taken along the lines A-A' of FIGS. 2A to 14A.
Figure 2C:
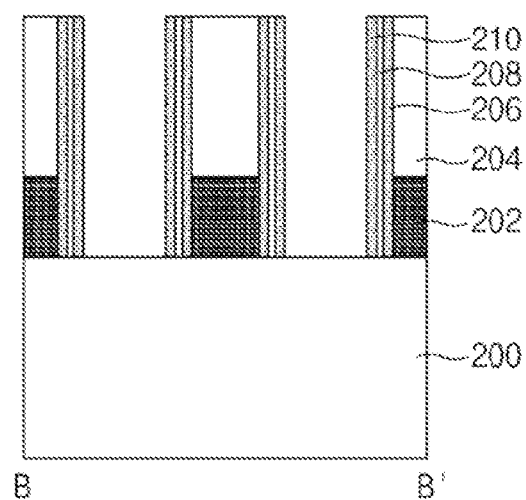
FIGS. 2C, 3C, 4C, 5C, 6C, 7C, 8C, 9C, 10C, 11C, 12C, 13C, and 14C are cross-sectional views illustrating the semiconductor devices taken along the lines B-B' of FIGS. 2A to 14A.

Referring to FIGS. 2A to 2C, a lower structure 200 may be formed over a substrate. The lower structure 200 may include multiple patterns, each of which includes a monocrystalline silicon material, a polysilicon material, a field oxide film, a field nitride film, etc., or an insulation film. For example, the lower structure 200 may include a semiconductor substrate with an active region and a device isolation film defining the active region. The device isolation film may be formed by a shallow trench isolation STI process. The active region may be formed in a rectangular shape having a long-axis and a short-axis, and may have a $6F^2$ structure in which a long-axis is extended in a diagonal direction. In addition, the lower structure 200 may include a buried gate (not shown) that is buried in both the active region and the device isolation film.

Subsequently, a bit line stack formed of a stack of a bit line BL 202 and a hard mask 204 may be formed over the lower structure 200. For example, after a conductive film to be used for a bit line BL and an insulation film to be used for the hard mask are sequentially formed over the lower structure 200, the bit-line conductive film and the hard-mask insulation film may be patterned using a mask defining a bit-line region, resulting in formation of a line-shaped bit line stack formed of a stack of the bit line BL 202 and the hard mask 204. The bit line 202 may include a metal material, and the hard mask 204 may include a nitride film. A substrate region to be connected to the bit line 202 may be used as an active region or a landing plug.

Subsequently, an insulation film 206 to be used for a spacer, a sacrificial film 208 to be used for an air-gap, and an insulation film 210 to be used for a spacer may be sequentially deposited thinly over the resultant structure in which the bit line 202 and the hard mask 204 are formed. The spacer insulation films 206 and 210 may include a nitride film. The sacrificial film 208 may include one selected from the group consisting of a titanium nitride layer, a tungsten oxide film, an aluminum oxide $Al_2O_3$ film, and a silicon Si film, or a combination thereof.

Subsequently, the insulation films 206 and 210 and the sacrificial film 208 may be selectively etched, such that the spacer including both the air-gap sacrificial film 208 and the spacer insulation films 206 and 210 may be formed only at a sidewall of the bit line stacks 202 and 204. A region to be connected to the storage node contact SNC in the lower structure 200 may be exposed. The exposed region may be an active region or a landing plug.

Figure 3A:
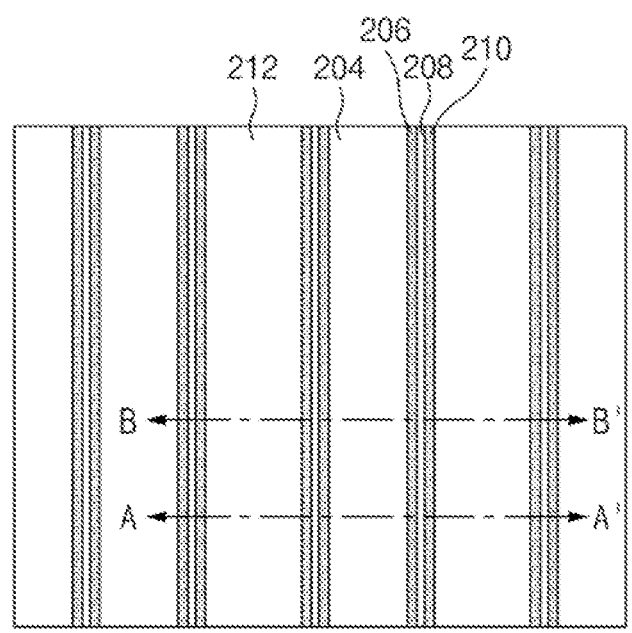
Figure 3B:
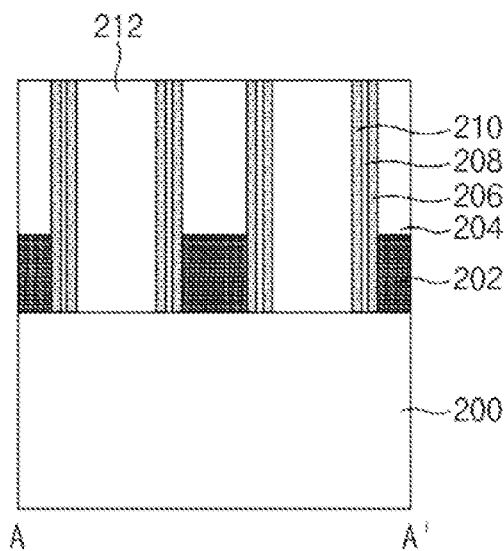
Figure 3C:
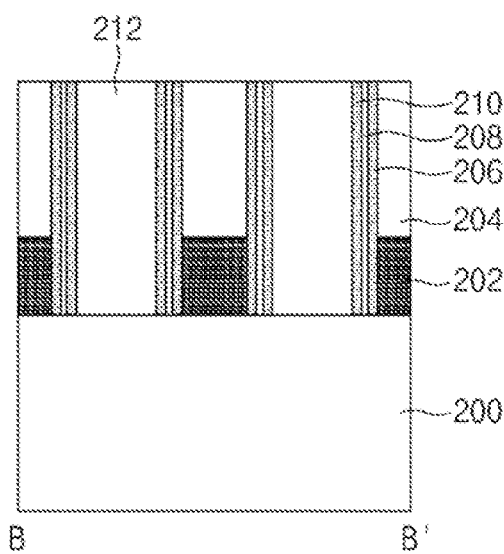

Referring to FIGS. 3A to 3C, an interlayer insulation film 212 may be formed to bury the spacing between the bit line stacks, and then planarized (CMP-processed). The interlayer insulation film 212 may include a spin on dielectric (SOD) film.

Figure 4A:
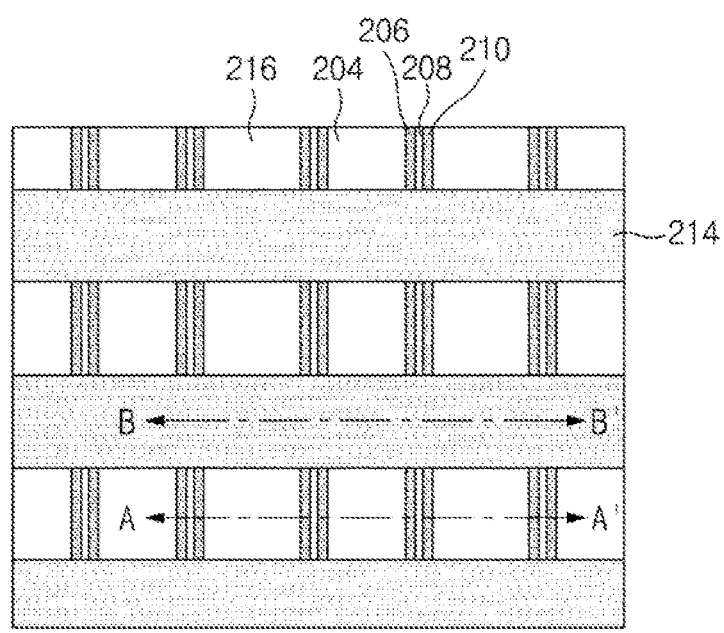
Figure 4B:
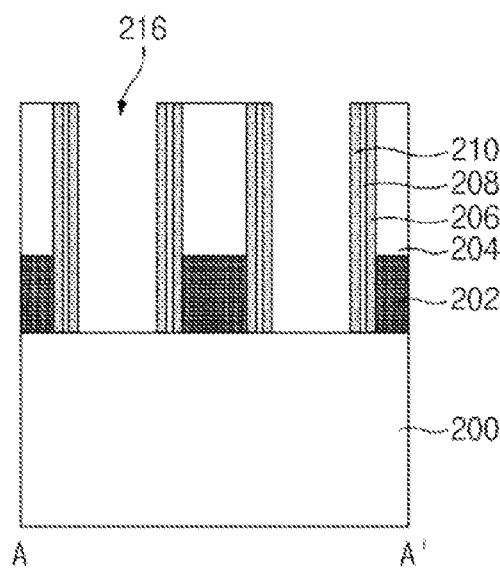
Figure 4C:
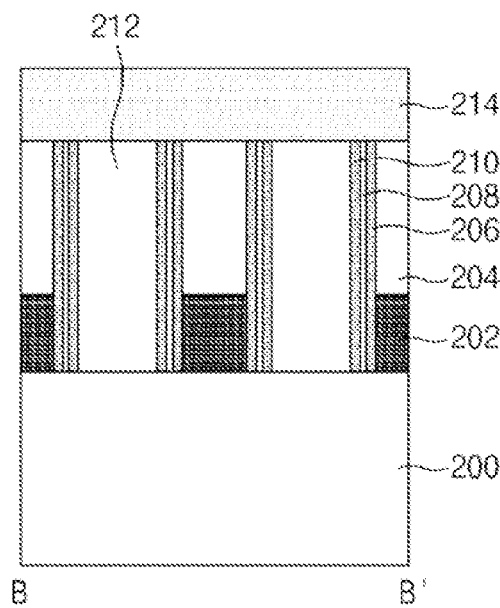

Referring to FIGS. 4A to 4C, a mask pattern 214 having a line-shaped open region perpendicular to the bit line stacks 202 and 204 may be formed over the interlayer insulation film 212, the hard mask 204, and the spacer insulation films 206 and 210, and the sacrificial film 208. The open region of the mask pattern 214 may include an SNC damascene pattern region.

Subsequently, the interlayer insulation film 212 interposed between the bit line stacks may be selectively etched using the mask pattern 214 as an etch mask on the basis of an etch selection ratio among the interlayer insulation film 212, the hard mask 204, the spacer insulation films 206 and 210, and the sacrificial film 208, resulting in formation of an SNC damascene hole 216.

Figure 5A:
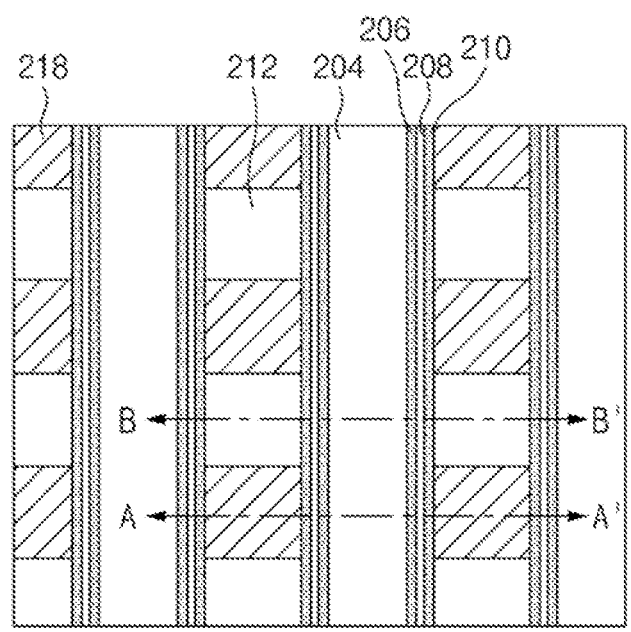
Figure 5B:
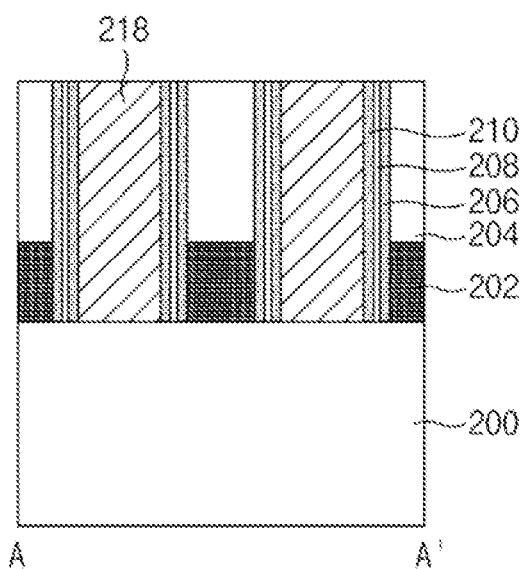
Figure 5C:
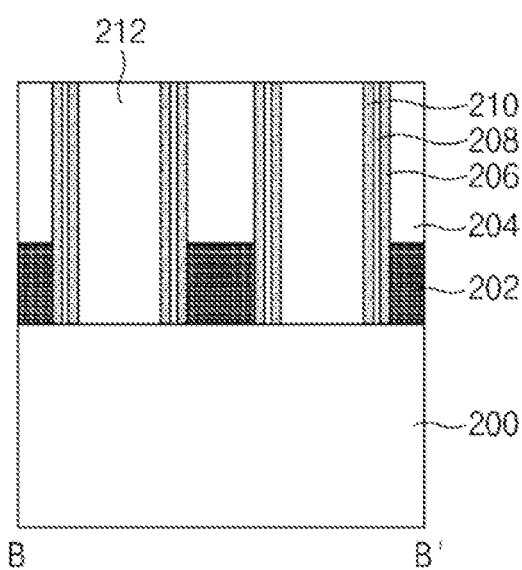

Referring to FIGS. 5A to 5C, after an insulation film is formed to bury the SNC damascene hole 216, the resultant insulation film may be planarized (CMP-processed), resulting in formation of an SNC damascene pattern 218. During the planarization (CMP), the mask pattern 214 may also be etched or removed. The SNC damascene pattern 218 may include a nitride film.

Therefore, the SNC region may be defined by the SNC damascene pattern 218 and the bit line stacks 202 and 204.

Figure 6A:
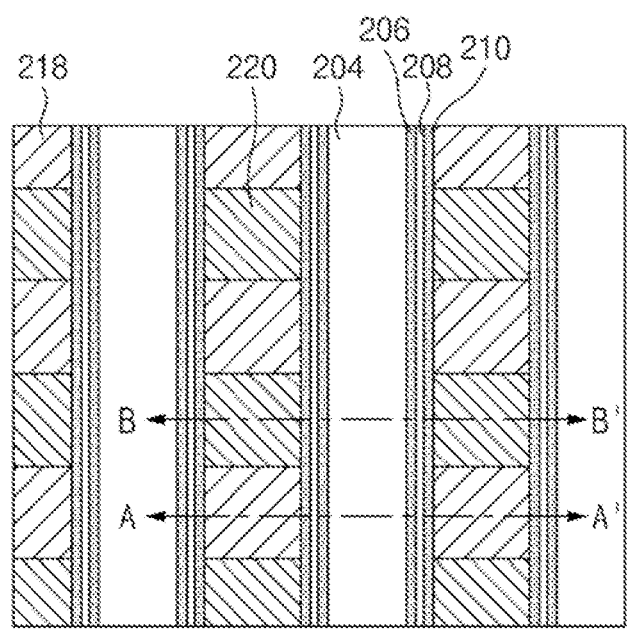
Figure 6B:
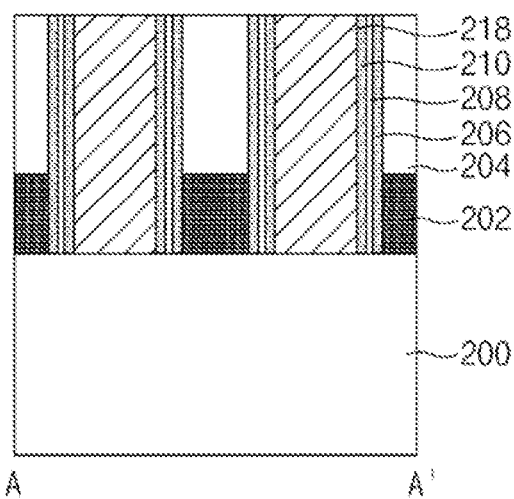
Figure 6C:
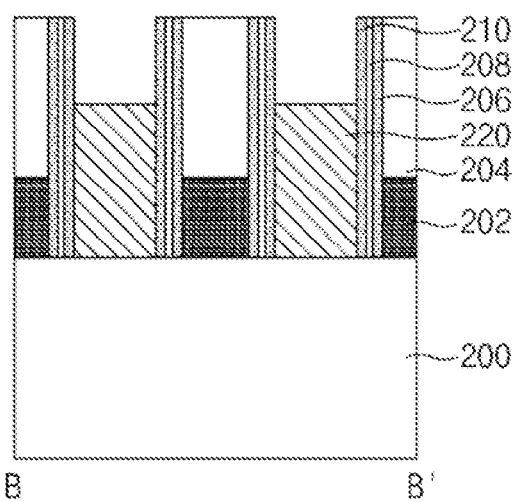

Referring to FIGS. 6A to 6C, the interlayer insulation film 212 formed in the SNC region may be etched so that a lower structure 200 of the SNC region is exposed. For example, only the interlayer insulation film 212 of the SNC region may be selectively etched using the etch selection ratio among the interlayer insulation film 212, the hard mask 204, the spacer insulation films 206 and 210, the sacrificial film 208, and the SNC damascene pattern 218, resulting in formation of the SNC hole.

Subsequently, after a conductive film for a lower storage node contact SNC is formed to bury the SNC hole, the conductive film may be etched back, resulting in formation of a first SNC 220. The first SNC 220 may be formed of one selected from the group consisting of polysilicon, silicide, and metal, or a combination thereof.

Specifically, the first SNC 220 according to this embodiment may be etched back such that the top surface of the first SNC 220 is below the top surface of the hard mask 204.

Figure 7A:
Figure 7B:
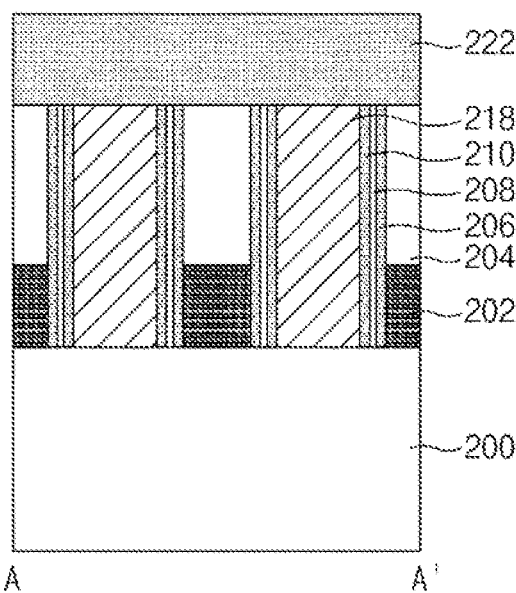
Figure 7C:
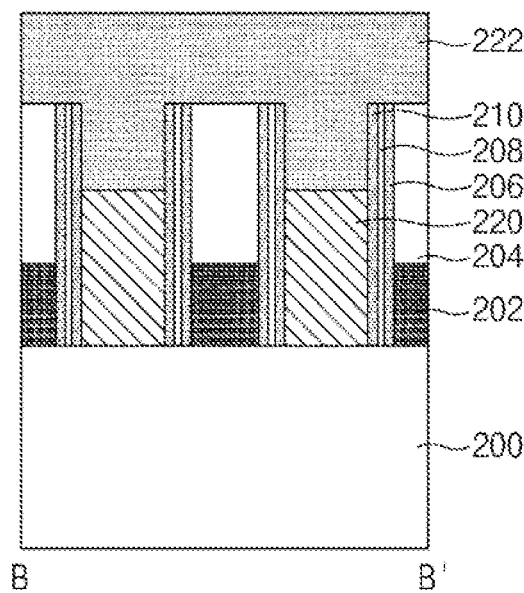

Referring to FIGS. 7A to 7C, a conductive film 222 to be used for an upper SNC may be formed over the resultant structure of FIG. 6, and then planarized (CMP-processed). The conductive film 222 for the upper SNC may include metal such as tungsten (W).

Figure 8A:
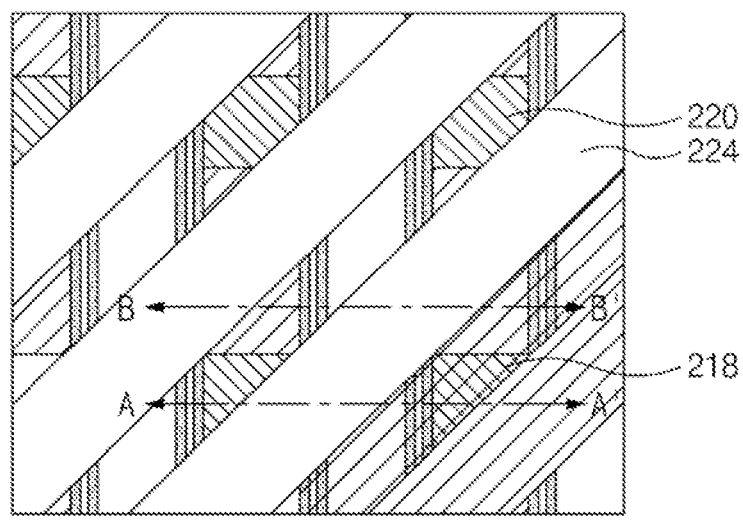
Figure 8B:
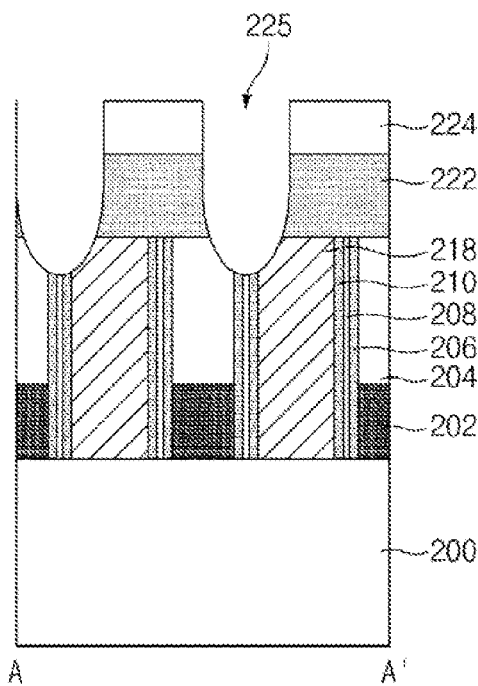
Figure 8C:
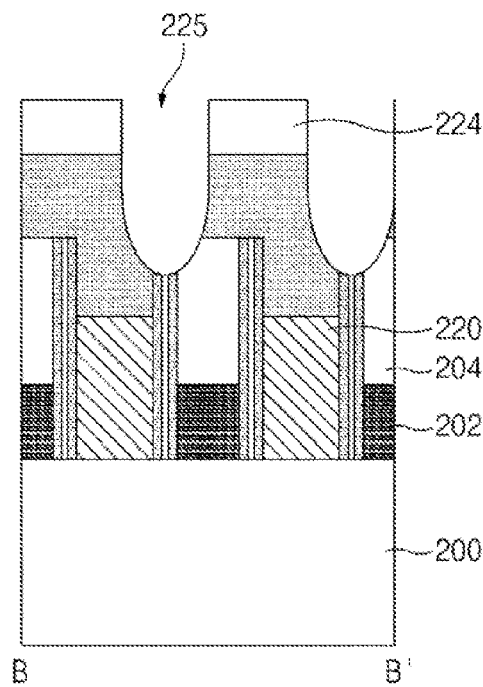

Referring to FIGS. 8A to 8C, an SNC cut mask 224 for patterning the conductive film 222 in a diagonal direction may be formed over the conductive film 222. Subsequently, the conductive film 222 may be etched until the sacrificial film 208 is exposed using the SNC cut mask 224, resulting in formation of a trench 225. During the formation of the trench 225, the hard mask 204, the spacer insulation films 206 and 210, and the SNC damascene pattern 218, which are located below the conductive film 222, may be partially etched.

Figure 9A:
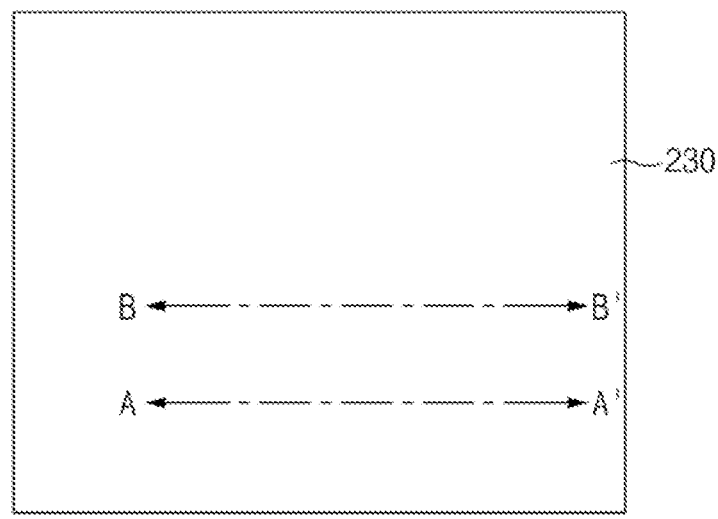
Figure 9B:
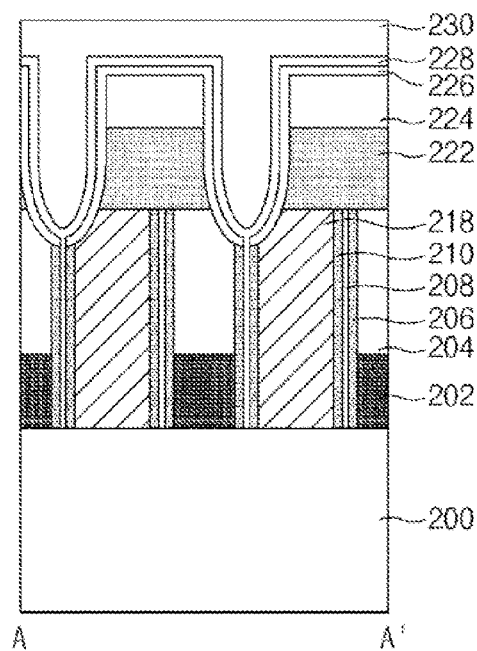
Figure 9C:
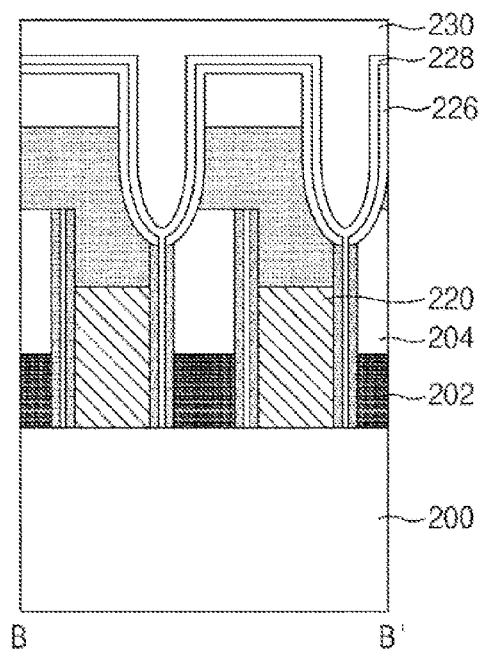

Referring to FIGS. 9A to 9C, after an insulation film 226 is formed in the trench 225, the insulation film 226 formed at a lower part of the trench 226 may be partially etched to expose the sacrificial film 208.

Subsequently, a sacrificial film 228 may be formed over the insulation film 226 exposing the sacrificial film 208. Then, an insulation film 230 may be formed over the sacrificial film 228 such that the trench 225 is filled with the insulation film 230, and the resultant insulation film 230 may be planarized (CMP-processed). The insulation films 226 and 230 may include a nitride film, and the sacrificial film 228 may be formed of the same material as the sacrificial film 208.

Figure 10A:
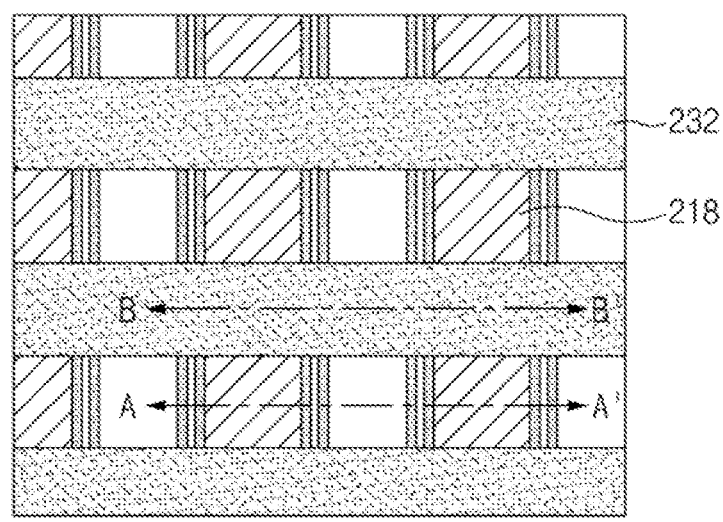
Figure 10B:
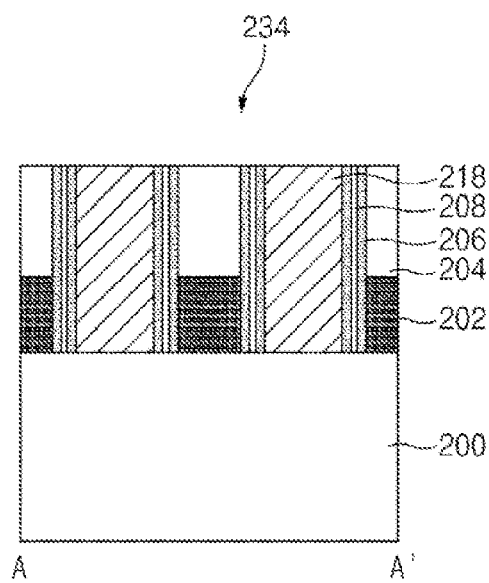
Figure 10C:
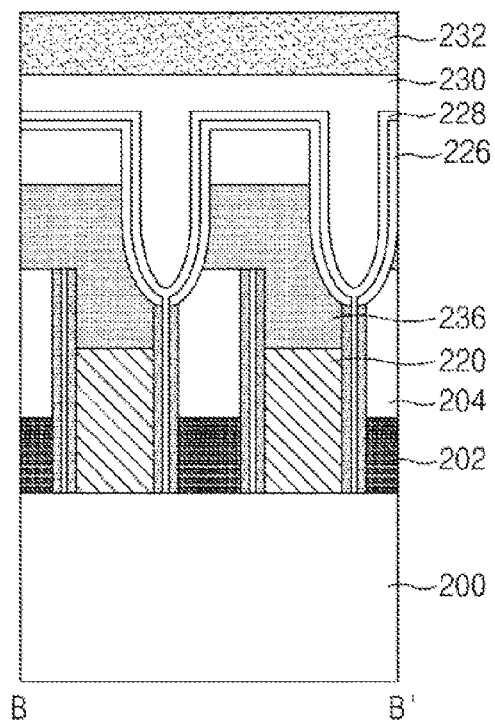

Referring to FIGS. 10A to 10C, a mask pattern 232 having a line-shaped open region perpendicular to the bit line stacks 202 and 204 may be formed over the insulation film 230. The mask pattern 232 may have the same pattern as the mask pattern 214 shown in FIG. 4A.

Subsequently, the insulation films 226 and 230, the sacrificial film 228, the conductive film 222, the hard mask 204, the spacer insulation films 206 and 210, and the SNC damascene pattern 218 may be etched using the mask pattern 232 as an etch mask, resulting in formation of a trench 234. The trench 234 may be deeply etched to a depth of the trench 226. The conductive film 222 may be isolated by the trench 234, resulting in formation of a second SNC 236.

Figure 11A:
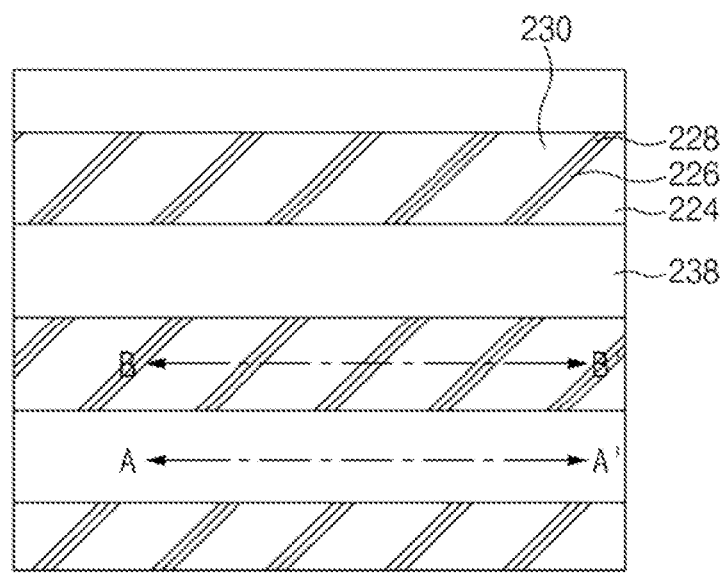
Figure 11B:
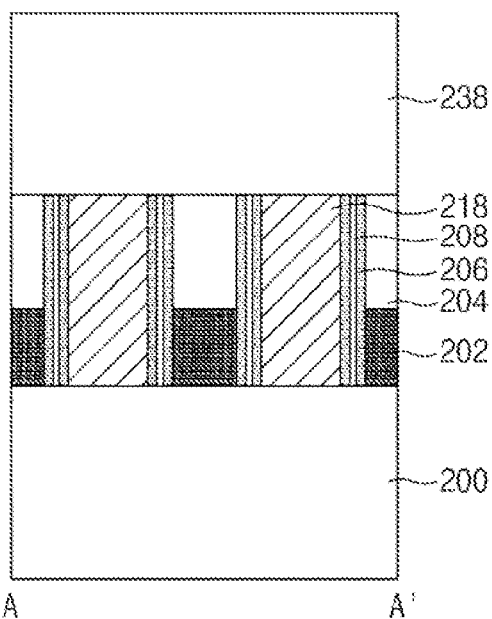
Figure 11C:
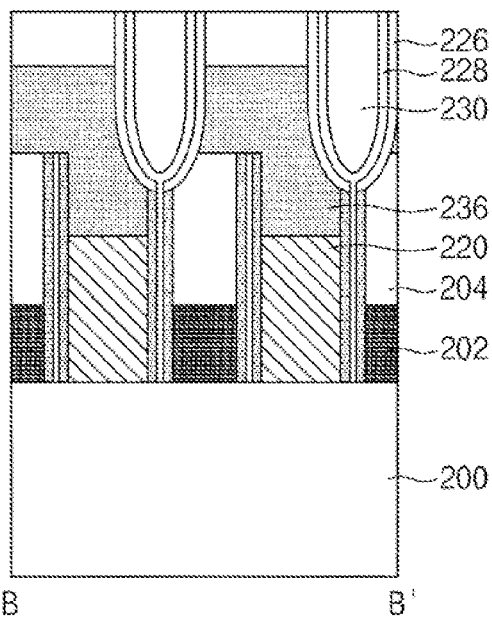

Referring to FIGS. 11A to 11C, after the insulation film 238 is formed to bury the trench 234, the insulation film 238, the mask pattern 232, and the insulation film 230 may be etched and planarized until the sacrificial film 228 is exposed.

Figure 12A:
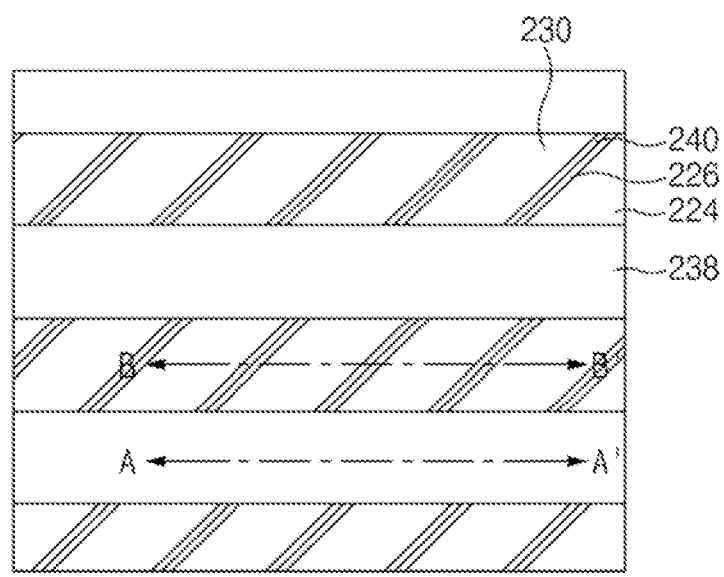
Figure 12B:
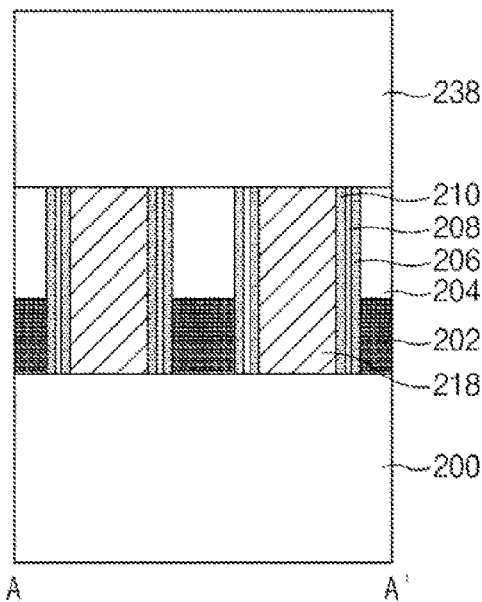
Figure 12C:
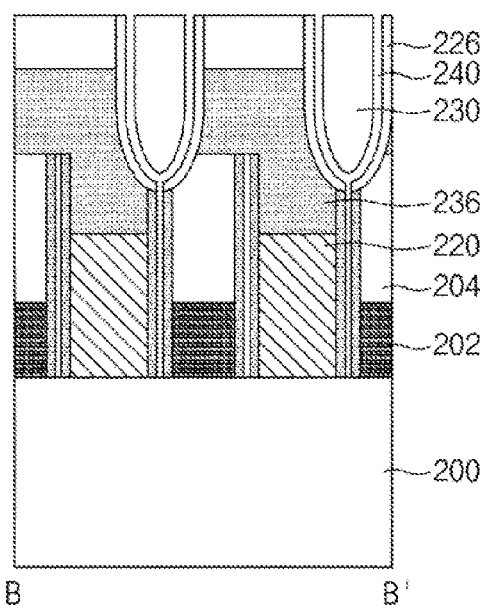

Referring to FIGS. 12A to 12C, the exposed sacrificial film 228 may be etched to form an air-gap 240. The sacrificial film 228 may be etched or removed by a dip-out process.

The insulation film 230 formed over the sacrificial film 228 may be coupled to the insulation film 238 and may be supported by the insulation film 238. As a result, although the sacrificial film 228 is etched or removed, the insulation film 230 does not collapse and its own position remains unchanged.

Figure 13A:
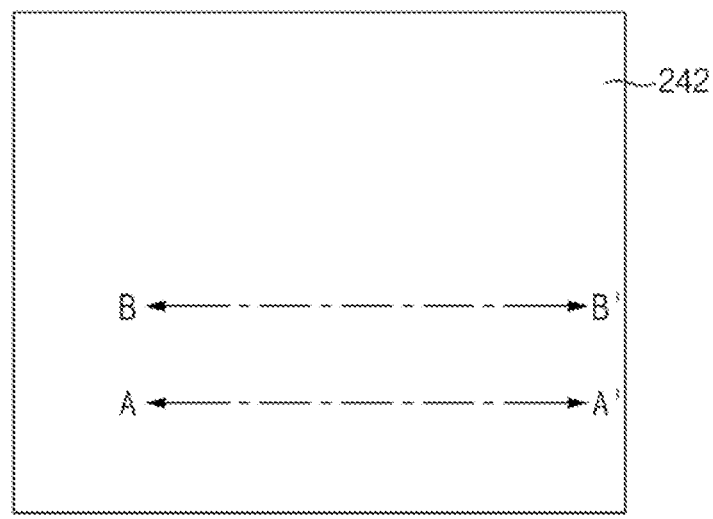
Figure 13B:
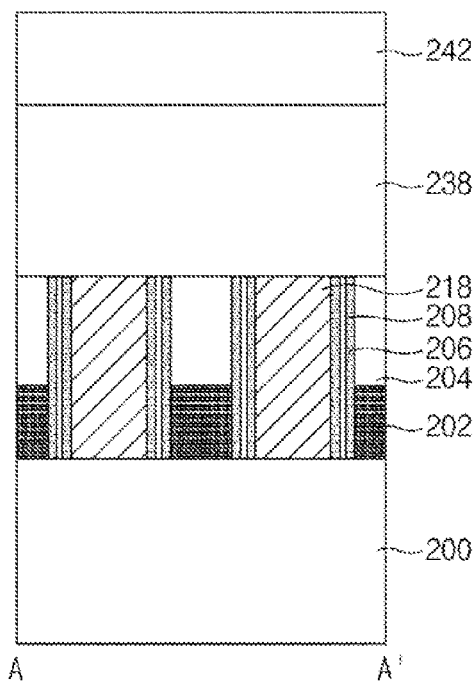
Figure 13C:
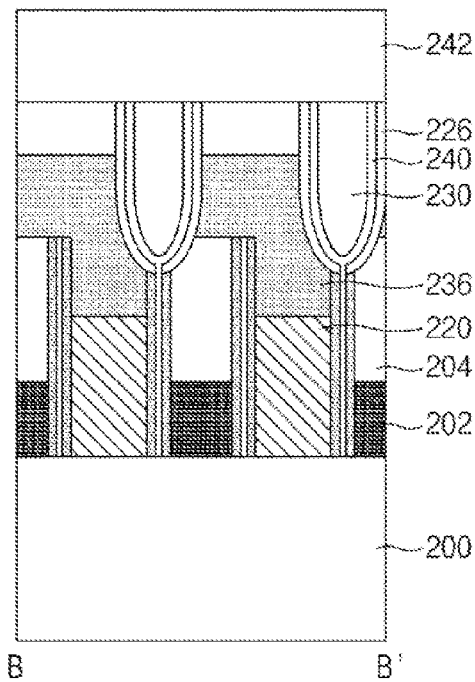

Referring to FIGS. 13A to 13C, a capping film 242 may be formed over the insulation films 226, 230 and 238, such that an upper part of the air-gap 240 is capped with the capping film 242.

Figure 14A:
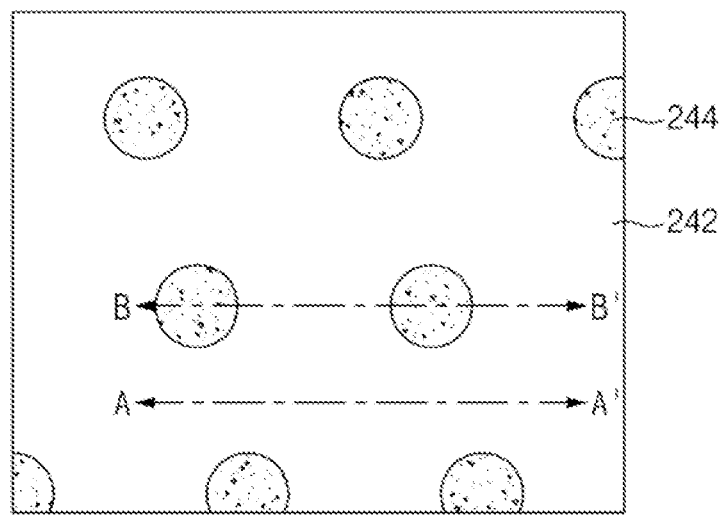
Figure 14B:
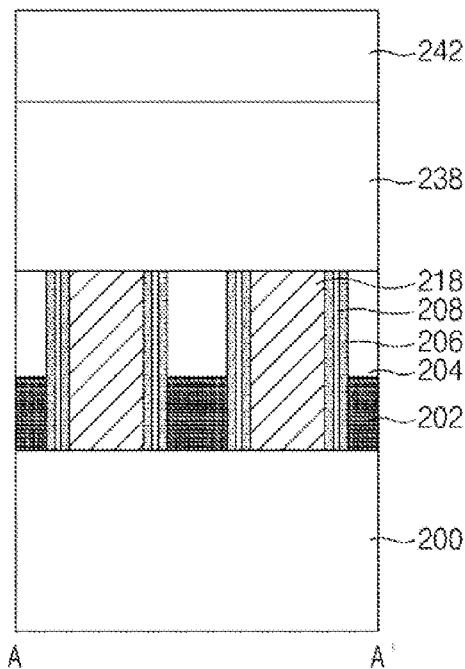
Figure 14C:
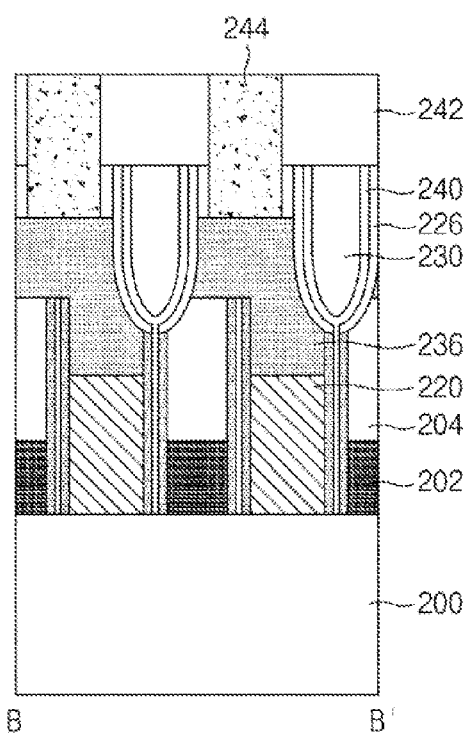

Referring to FIGS. 14A to 14C, after a mask pattern (not shown) defining the storage node region is formed over the capping film 242, the capping film 242 and the SNC cut mask 224 may be etched using the mask pattern in such a manner that the second SNC 236 is exposed, resulting in formation of a storage node hole. Subsequently, the conductive film may be formed to bury the storage node hole and may be then planarized (CMP-processed), resulting in formation of a storage node 244 acting as a lower electrode of a capacitor.

Figure 15A:
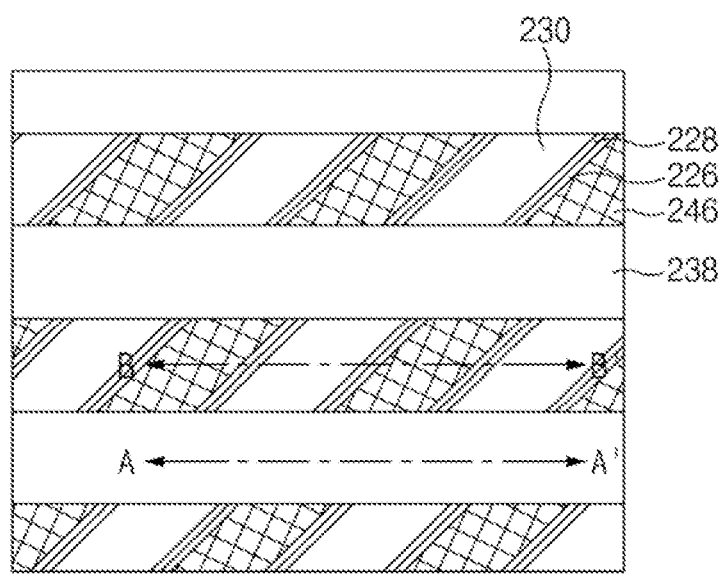
FIG. 15A is a plan view illustrating a method for fabricating a semiconductor device according to another embodiment of the present disclosure.
Figure 15B:
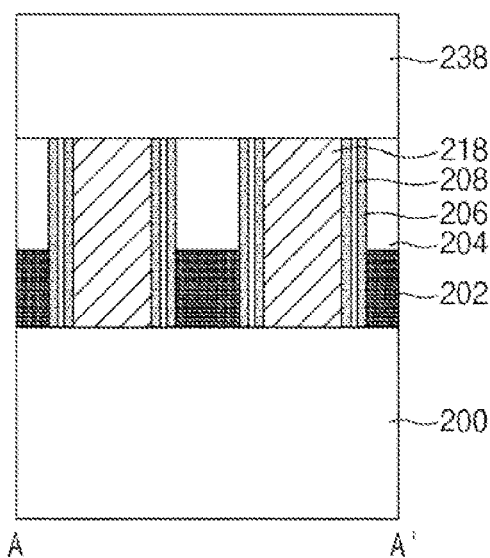
FIG. 15B is a cross-sectional view illustrating the semiconductor device taken along the line A-A' of FIG. 15A.
Figure 15C:
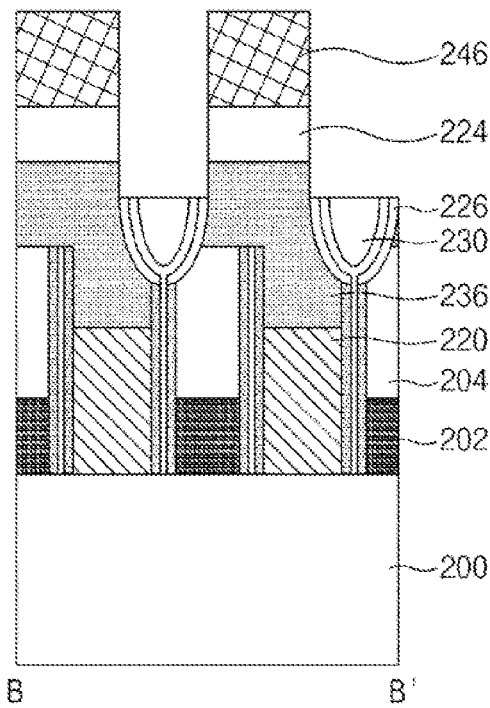
FIG. 15C is a cross-sectional view illustrating the semiconductor device taken along the line B-B' of FIG. 15A.

FIG. 15 is a plan view illustrating a method for fabricating a semiconductor device according to another embodiment of the present disclosure. FIG. 15B is a cross-sectional view illustrating the semiconductor device taken along the line A-A' of FIG. 15A. FIG. 15C is a cross-sectional view illustrating the semiconductor device taken along the line B-B' of FIG. 15A.

As a method for exposing the sacrificial film 228 to form the air-gap, the insulation film 238, the mask pattern 232, and the insulation film 230 may be completely etched and planarized (CMP-processed) as shown in FIGS. 11A to 11C.

However, as shown in FIG. 15A, the sacrificial film 228 and the insulation films 226, 230 and 238 may be etched to a predetermined depth using a dip-out mask 248 defining an upper region of the second SNC 236 being isolated, such that the sacrificial film 228 can be exposed. The insulation films 226 and 230 and the sacrificial film 228 may be etched such that the top surface of the insulation films 226 and 230 and the sacrificial film 228 is below the top surface of the second SNC 236.

Subsequent processes may be substantially the same as those described with reference to FIGS. 12 to 14.

As is apparent from the above description, the structure of an air-gap between a storage node contact SNC and a bit line may be improved, such that parasitic capacitance between metal lines in the semiconductor device can be effectively reduced.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents may be possible. The invention is not limited by the type of deposition, etching polishing, and patterning steps described herein. Nor is the invention limited to any specific type of semiconductor device. For example, the present disclosure may be implemented in a dynamic random access memory (DRAM) device or non-volatile memory device. Other additions, subtractions, or modifications are obvious in view of the present disclosure and are intended to fall within the scope of the appended claims.

What is claimed is:

1. A semiconductor device comprising:
   a bit line stack;
   a plurality of storage node contacts located at both sides of the bit line stack; and
   an air-gap located between the bit line stack and the storage node contacts, and extended above the bit line stack,
   wherein the bit line stack includes:
   a conductive line; and
   a hard mask stacked on the conductive line.

2. The semiconductor device according to claim 1, wherein the storage node contacts include:

a first storage node contact; and a second storage node contact above the first storage node contact and the bit line stack.

3. The semiconductor device according to claim 2, wherein a top surface of the first storage node contact is below a top surface of the bit line stack.

4. The semiconductor device according to claim 2, wherein the air-gap is extended above a top surface of the second storage node contact.

5. The semiconductor device according to claim 2, wherein the air-gap includes:

a first air-gap located at both sidewalls of the bit line stack; and a second air-gap interposed between the second storage node contacts, which are contiguous, and having a double-layered structure extending from the first air-gap.

6. The semiconductor device according to claim 5, wherein the first air-gap has a single-layered structure.

7. The semiconductor device according to claim 5, wherein the second air-gap extends from one of the first air-gaps located at both sides of the bit line stack.

8. The semiconductor device according to claim 5, wherein the second air-gap has a double-layered structure in which air-gaps are respectively located at facing sidewalls of the second storage node contacts on the basis of the bit line stack interposed therebetween.

9. The semiconductor device according to claim 5, wherein the first air-gap is in a spacer insulation film of the bit line stack.

10. The semiconductor device according to claim 5, wherein the second air-gap has a U-shaped structure.

* * * * *